United States Patent
Everitt et al.

(10) Patent No.: US 6,191,926 B1
(45) Date of Patent: Feb. 20, 2001

(54) SPIN VALVE MAGNETORESISTIVE SENSOR USING PERMANENT MAGNET BIASED ARTIFICIAL ANTIFERROMAGNET LAYER

(75) Inventors: Brenda A. Everitt, Minneapolis; Johannes van Ek, St. Louis Park, both of MN (US)

(73) Assignee: Seagate Technology LLC, Scotts Valley, CA (US)

( * ) Notice: Under 35 U.S.C. 154(b), the term of this patent shall be extended for 0 days.

(21) Appl. No.: 09/161,898

(22) Filed: Sep. 28, 1998

Related U.S. Application Data

(60) Provisional application No. 60/084,656, filed on May 7, 1998.

(51) Int. Cl.$^7$ .................................................... G11B 5/39
(52) U.S. Cl. ................................................. 360/324.11
(58) Field of Search ................................ 360/113, 324.1, 360/324.11; 324/252, 207.21; 338/32 R, 32 H

(56) References Cited

U.S. PATENT DOCUMENTS

| | | | |
|---|---|---|---|
| 4,949,039 | 8/1990 | Grünberg | 324/252 |
| 5,206,590 | 4/1993 | Dieny et al. | 324/252 |
| 5,465,185 * | 11/1995 | Heim et al. | 360/113 |
| 5,475,304 | 12/1995 | Prinz | 324/207.21 |
| 5,534,355 | 7/1996 | Okuno et al. | 428/611 |
| 5,583,725 | 12/1996 | Coffey et al. | 360/113 |
| 5,616,370 | 4/1997 | Okuno et al. | 427/547 |
| 5,650,887 | 7/1997 | Dovek et al. | 360/75 |
| 5,686,838 | 11/1997 | van den Berg | 324/252 |
| 5,688,605 | 11/1997 | Iwasaki et al. | 428/611 |
| 5,696,655 | 12/1997 | Kawano et al. | 360/113 |
| 5,696,656 | 12/1997 | Gill et al. | 360/113 |
| 5,701,223 * | 12/1997 | Fontana, Jr. et al. | 360/113 |
| 5,702,832 | 12/1997 | Iwasaki et al. | 428/611 |
| 5,705,973 | 1/1998 | Yuan et al. | 338/32 R |
| 5,717,550 | 2/1998 | Nepela et al. | 360/113 |
| 5,725,963 | 3/1998 | Iwasaki et al. | 428/611 |
| 5,738,946 | 4/1998 | Iwasaki et al. | 428/611 |
| 5,739,988 | 4/1998 | Gill | 360/113 |
| 5,739,990 | 4/1998 | Ravipati et al. | 360/113 |
| 5,742,162 | 4/1998 | Nepela et al. | 324/252 |
| 5,751,521 | 5/1998 | Gill | 360/113 |
| 5,756,191 | 5/1998 | Hashimoto et al. | 428/209 |
| 5,768,069 * | 6/1998 | Mauri | 360/113 |
| 5,828,529 * | 10/1998 | Gill | 360/113 |
| 5,898,549 * | 4/1999 | Gill | 360/113 |

OTHER PUBLICATIONS

"Linearity of Unshielded Spin–Valve Sensors", by N. Sugaware et al., *American Institute of Physics*, 1997, 3 pages, pp. 523–525.

"AMR Effect in Spin–Valve Structure", by Y. Uehara et al., *IEEE Transactions on Magnetics*, vol. 32, No. 5, Sep. 1996, pp. 3432–3433.

* cited by examiner

Primary Examiner—William R. Korzuch
(74) Attorney, Agent, or Firm—Westman, Champlin & Kelly, P.A

(57) ABSTRACT

A spin valve magnetoresistive sensor of the type used in a data storage system includes a free layer extending in a sensor plane. The free layer has a magnetization which changes in the presence of a magnetic field. An artificial antiferromagnet layer is used as a pinned layer. The artificial antiferromagnet layer includes a first ferromagnetic layer extending in the sensor plane which has a first ferromagnetic layer vector. A second ferromagnetic layer extends in the sensor plane and includes a second ferromagnetic layer vector. A spacer layer of non-magnetic material extends in the sensor plane and is positioned between the first and second ferromagnetic layers. The first and second magnetization vectors in the first and second ferromagnetic layers include vector components which are directed perpendicular to the air bearing surface which is parallel to the sensor plane due to a DC bias field provided by two permanent magnet poles.

15 Claims, 3 Drawing Sheets

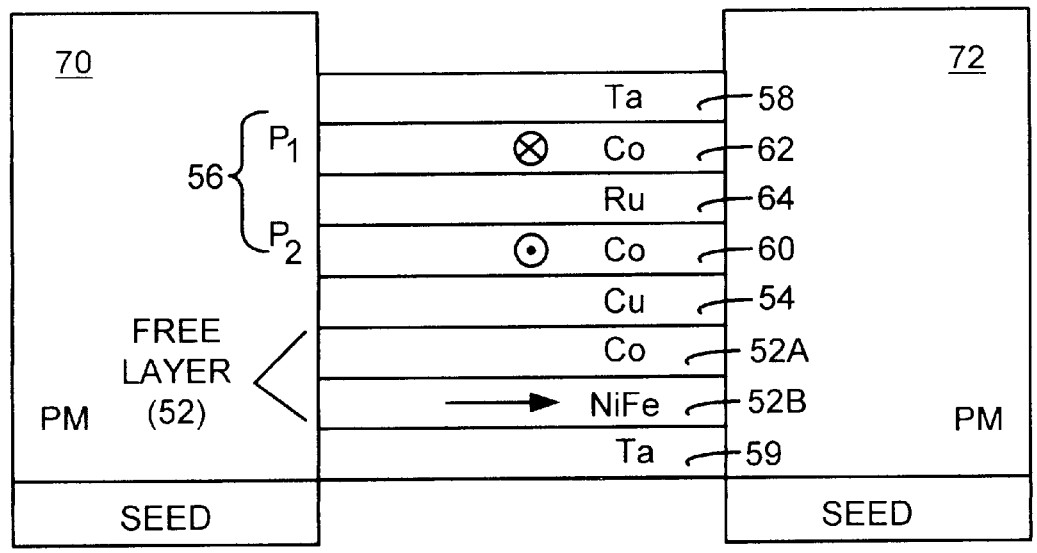
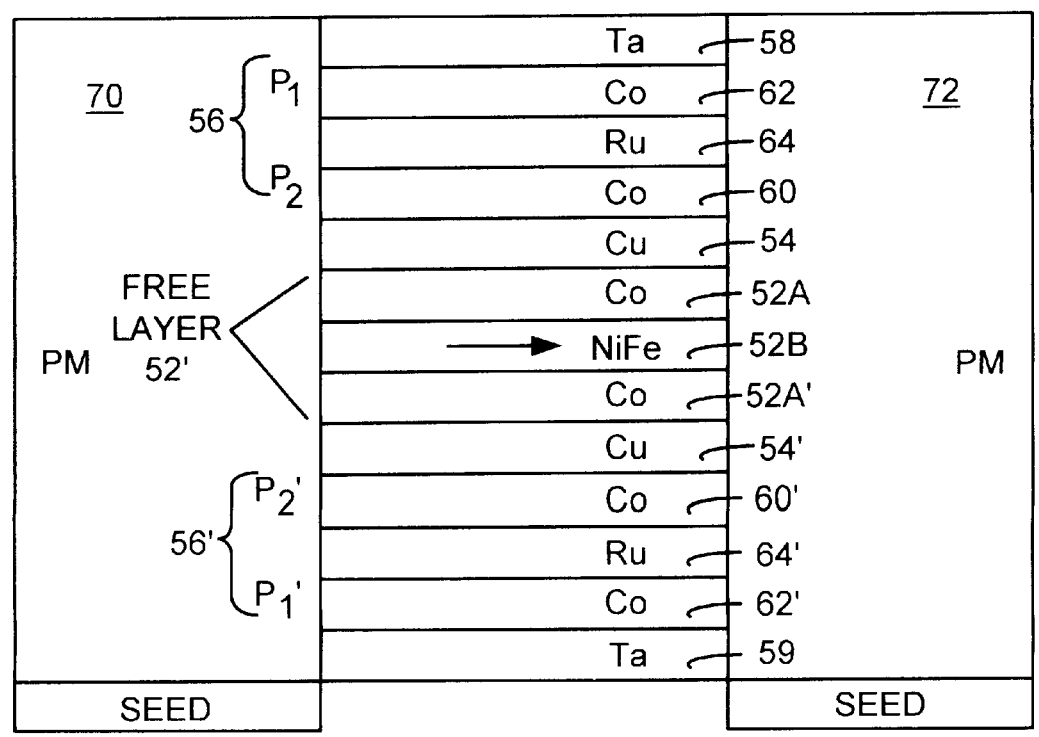

SPIN VALVE MAGNETORESISTIVE SENSOR USING PERMANENT MAGNET BIASED ARTIFICIAL ANTIFERROMAGNET LAYER

The present invention claims priority to Provisional application Ser. No. 60/084,656, filed May 7, 1998 and entitled SPIN VALVE USING A BIASED ARTIFICIAL ANTIFERROMAGNET PINNED LAYER.

BACKGROUND OF THE INVENTION

The present invention relates to data storage systems. More specifically, the present invention relates to data storage systems using read heads which utilize the giant magnetoresistive (GMR) effect.

Magnetic sensors utilizing the GMR effect, frequently referred to as "spin valve" sensors, are known in the art. A spin valve sensor is typically a sandwiched structure consisting of two ferromagnetic layers separated by a thin non-ferromagnetic layer. One of the ferromagnetic layers is called the "pinned layer" because it is magnetically pinned or oriented in a fixed and unchanging direction by an adjacent antiferromagnet layer, commonly referred to as the "pinning layer," through exchange coupling. The other ferromagnetic layer is called the "free" or "unpinned" layer because the magnetization is allowed to rotate in response to the presence of external magnetic fields.

One type of self pinned layer is known in the art as an artificial antiferromagnet layer (AAF). Such a layer is formed by three layers, a first ferromagnetic layer, a second ferromagnetic layer and a non-magnetic spacer layer separating the two ferromagnetic layers. The two ferromagnetic layers have magnetic vectors which are biased in antiparallel directions and in the plane of the sensor. This is described in, for example, U.S. Pat. No. 5,583,725, issued Dec. 10, 1996 to Coffey et al., entitled "SPIN VALVE MAGNETORESISTIVE SENSOR WITH SELF-PINNED LAMINATED LAYER AND MAGNETIC RECORDING SYSTEM USING THE SENSOR which is incorporated herein by reference.

SUMMARY OF THE INVENTION

A spin valve magnetoresistive sensor of the type used in a data storage system includes a free layer extending in a sensor plane. The free layer has a magnetization which changes in the presence of a magnetic field. An artificial antiferromagnet layer includes a first ferromagnetic layer extending in the sensor plane which has a first ferromagnetic layer vector. A second ferromagnetic layer extends in the sensor plane and includes a second ferromagnetic layer vector. A spacer layer of non-magnetic material extends in the sensor plane and is positioned between the first and second ferromagnetic layers. At least two permanent magnet poles are provided whereby the first and second magnetization vectors in the first and second ferromagnetic layers include vector components which are directed perpendicular to the sensor plane, i.e., in a "cross track" direction.

BRIEF DESCRIPTION OF THE DRAWINGS

FIG. 2 is a simplified cross-sectional view of a giant magnetoresistive (GMR) or "spin valve" sensor in accordance with the present invention.

FIG. 5 is a simplified diagram of a spin valve in accordance with another embodiment.

DETAILED DESCRIPTION OF THE PREFERRED EMBODIMENTS

The present invention relates to magnetoresistive sensors of the giant magnetoresistive (GMR) or "spin valve" type which are used to read back information from storage media such as magnetic discs. The present invention includes an artificial antiferromagnet layer having magnetic vectors biased in a new manner to reduce a stray field from the pinned layer in a free layer of the sensor. The artificial antiferromagnet layer of the present invention is biased using two permanent magnet poles to have magnetic vectors with a component which is perpendicular to the free layer quiescent bias. In one embodiment, this is achieved using two permanent magnets in, for example, an "abutted junction" type design.

Figure 1:
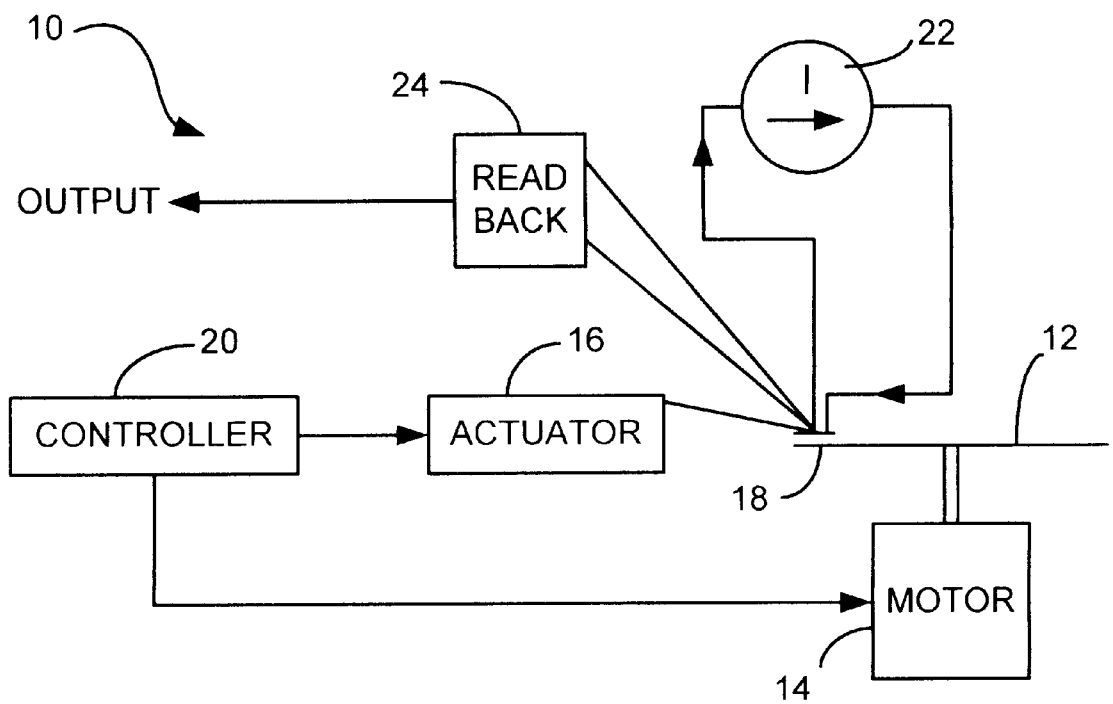
FIG. 1 is a simplified diagram of a storage system using a magnetoresistive sensor in accordance with the present invention.

The present invention includes a new spin valve sensor which may be used in a data storage system such as data storage system 10 shown in FIG. 1. System 10 includes storage medium 12 such as a magnetic disc which is rotated by motor 14. An actuator 16 is coupled to a slider 18 which is used to position a magnetoresistive sensor (not shown in FIG. 1) over a surface of disc 12. A controller 20 controls positioning of slider 18. The magnetoresistive sensor operates by receiving a sense (or bias) current I from current source 22. Variations in a magnetic field applied to the magnetoresistive sensor due to magnetization of disc 12 cause a change in the electrical resistance of the sensor. This change in electrical resistance is detected with readback circuitry 24 which responsively provides data output. Operation of spin valves is known in the art and is described, for example, in U.S. Pat. No. 4,949,039, issued Aug. 14, 1990 to Grünberg, which is hereby incorporated by reference.

FIG. 2 is a cross sectional view of magnetoresistive sensor 50 in accordance with the present invention. Sensor 50 includes free layer 52, copper spacer 54 and an artificial antiferromagnet layer 56 in accordance with the invention. Ta layers 58 and 59 are positioned on opposite sides of sensor 50. In the particular embodiment shown, free layer 52 comprises a bilayer 52A, 52B of Co and NiFe, respectively.

Artificial antiferromagnet layer 56 comprises a first ferromagnetic layer 60, a second ferromagnetic layer 62 and a non-ferromagnetic layer 64 which separates layers 60 and 62. In the specific embodiment shown, layers 60 and 62 comprise Co and layer 64 comprises Ru. Artificial antiferromagnet layers are known in the art and are described, for example, in U.S. Pat. No. 5,583,725 to Coffey et al. which issued Dec. 10, 1996, entitled "SPIN VALVE MAGNETORESISTIVE SENSOR WITH SELF-PINNED LAMINATED LAYER AND MAGNETIC RECORDING SYSTEM USING THE SENSOR." Ferromagnetic layers 60 and 62 are coupled across non-magnetic layer 64 and have vectors aligned substantially antiparallel such that they are "self pinned." Artificial antiferromagnet layers may be preferred in some instances to a separate pinning layer which utilizes, for example, a metallic or an oxide antiferromagnet layer such as NiMn, NiO or CoNiO and may offer higher sheet resistance and enhanced GMR effect.

In the present invention, the magnetic vectors of ferromagnetic layers 60 and 62 are aligned antiparallel and perpendicular to the magnetization vector of free layer 52 to the use of permanent magnets 70 and 72. Since the direction of layer 56 is not stabilized by an antiferromagnet pinning layer, it will undergo a "spin flop" rotation at some applied bias field in which a magnetization directions of the two ferromagnetic layers 60 and 62 will align approximately perpendicular to the bias field direction applied due to permanent magnets 70 and 72. The bias field provided by permanent magnet 70 and 72 is parallel to the air bearing surface of the sensor 50 for an abutted junction configuration. The permanent magnetic field stabilizes the structure. The use of permanent magnets to bias the structure in accordance with the present invention is preferred over the use of "exchange tabs" used in the Coffey et al. device which utilizes lateral extensions. The present invention does not require the use of an antiferromagnet material for stabilization. The pinned layer in the Coffey patent (Co/Ru/Co layers) does not have any additional stabilization and may become unstable during operation. Further, U.S. Pat. No. 5,768,089 to Mauri requires a bias current to bias the device and is unbiased in the quiescent state. The addition of the permanent magnets in the present invention provides a more stable device.

In one embodiment, the nominal thickness of the various layers is as follows: bottom layer 59 is 30 Å, layer 52A is 30 Å, 52B is 40 Å, 54 is 38 Å, 60 is 30 Å, 64 is 8 Å, 62 is slightly more than 30 Å and the top layer 58 is 70 Å. In one embodiment, layer 62 is preferably slightly thicker than layer 60. This is because there is a small amount of coupling between layer 60 and free layer 52. By making layer 62 slightly thicker than layer 60, the parallel coupling can be somewhat offset and the sensor made more robust.

The field from permanent magnets 70 and 72 orients the pinned layer 56 magnetic vectors 90° relative to the free layer 52 magnetic vector as illustrated in FIG. 2. Further, permanent magnets 70 and 72 act to the bias the free layer 52 as in a conventional abutted junction readhead. Magnets 70 and 72 may comprise, for example, CoPt or CoCrPt.

Figure 3A:
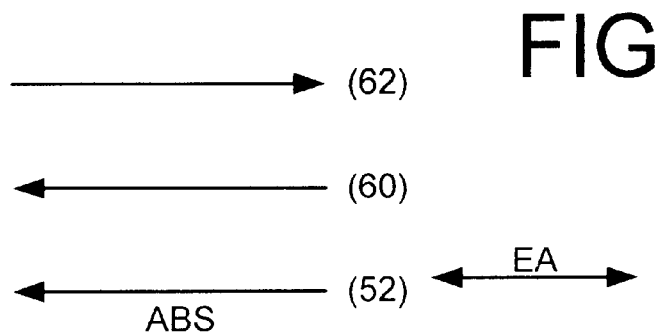
FIGS. 3A and 3B are diagrams showing magnetization vectors of a spin valve, "as deposited".
Figure 3B:
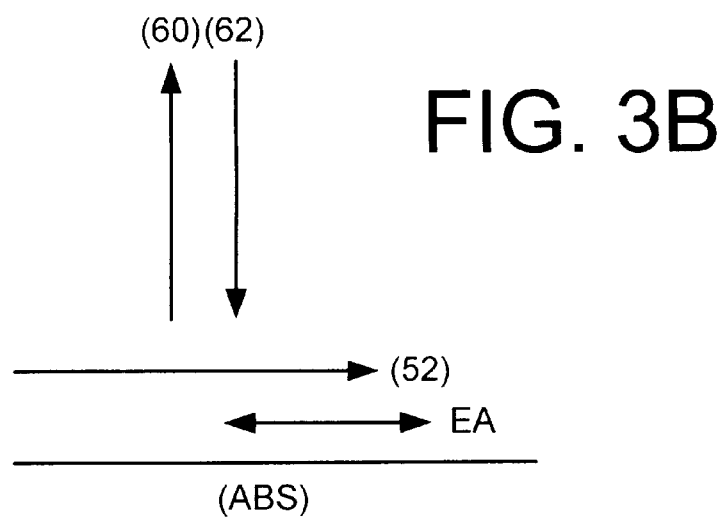
Figure 4:
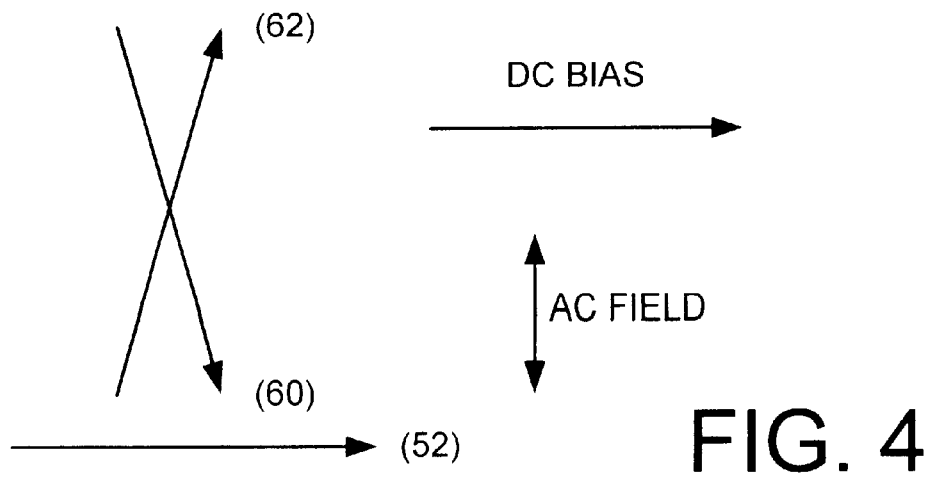
FIG. 4 is a vector diagram illustrating magnetization vectors of a spin valve having an artificial antiferromagnet layer biased in accordance with the present invention.

FIGS. 3A and 3B are vector diagrams illustrating magnetization vectors of a spin valve, "as deposited." As illustrated in FIG. 3A, the magnetization vectors of ferromagnetic layers 60 and 62 are aligned antiparallel and are aligned with the magnetization vector of the free layer along their easy access (EA). In FIG. 3B, the "as deposited" orientation of the wafer is achieved by rotating the wafer 90° in situ between deposition of the free and pinned layers. FIG. 4 shows the spin valve after application of permanent magnets 70 and 72 which provide a DC bias field as shown. This DC bias field causes the magnetization vector layers 60 and 62 to rotate approximately perpendicular to the magnetization vector of layer 52 and align antiparallel.

FIG. 5 is a simplified diagram of a spin valve 50' in accordance with another embodiment of the invention. The spin valve 50' has a symmetric structure similar to a dual spin valve which uses two artificial antiferromagnet layers and a free layer located in the center. Similar elements in spin valve 50 have retained their numbering. The additional layers in spin valve 50' are designated with a prime symbol. Spin valve 50' includes a second artificial antiferromagnet layer 56' composed of three layers, 60', 62' and 64', a Cu spacer 54' and an additional Co layer 52A' which is part of free layer 52'.

Although the present invention has been described with reference to preferred embodiments, workers skilled in the art will recognize that changes may be made in form and detail without departing from the spirit and scope of the invention. For example, any type of AAF layer may be used such as those made with Co, CoFe, Ni, Fe, NiFeCo and alloys, Ru, Cr, Ag, etc. and bilayers such as Co/NiFe, Co/NiFeCo, etc.

What is claimed is:

1. A spin valve magnetoresistive sensor, comprising:

a free layer extending in a sensor plane having a magnetization which changes in the presence of a magnetic field;

a spacing layer;

an artificial antiferromagnet layer separated from the free layer by the spacing layer, comprising:

a first ferromagnetic layer extending in the sensor plane and having a first ferromagnetic layer vector;

a second ferromagnetic layer extending in the sensor plane and having a second ferromagnetic layer vector;

a spacer layer of nonmagnetic material extending in the sensor plane and positioned between the first and second ferromagnetic layers; and two permanent magnet poles providing a DC bias field whereby the first and second magnetization vectors in the first and second ferromagnetic layers include components in a direction perpendicular to the sensor plane.

2. The spin valve magnetoresistive sensor of claim 1 wherein the first and second ferromagnetic layers comprise Co and the spacer layer comprises Ru.

3. The spin valve magnetoresistive sensor of claim 1 including two permanent magnets to provide the two poles.

4. The spin valve magnetoresistive sensor of claim 1 wherein the first and second magnetization vectors are substantially perpendicular to an air bearing surface which is parallel with the sensor plane.

5. The spin valve magnetoresistive sensor of claim 1 wherein the free layer has an easy axis of magnetization which is substantially parallel with an air bearing surface which is parallel with the sensor plane.

6. The spin valve magnetoresistive sensor of claim 1 including third and fourth ferromagnetic layers separated by a spacer, the third and fourth ferromagnetic layers having magnetization vectors with components perpendicular to an air bearing surface which is parallel with the sensor plane due to the DC bias field from the poles.

7. The spin valve magnetoresistive sensor of claim 1 wherein the first ferromagnetic layer is closer to the free layer than the second ferromagnetic layer and the second ferromagnetic layer has a thickness which is greater than a thickness of the first ferromagnetic layer.

8. The spin valve magnetoresistive sensor of claim 1 wherein the DC bias field causes the first ferromagnetic layer and the second ferromagnetic layer to undergo a spin flop rotation in which the first and second magnetization vectors align approximately perpendicular to the DC bias field.

9. The spin valve magnetoresistive sensor of claim 1 wherein the sensor is biased without a pinning layer.

10. The spin valve magnetoresistive sensor of claim 1 wherein the two poles are in an abutted junction configuration.

11. The spin valve magnetoresistive sensor of claim 1 wherein the first and second ferromagnetic layers are selected from the group consisting of NiFe, Co, NiFeCo, CoFe, a Co/NiFe bilayer, and a Co/NiFeCo bilayer.

12. The spin valve magnetoresistive sensor of claim 1 wherein the spacer layer is selected from the group consisting of Ru, Cr and Ag.

13. A storage system for storing information, comprising:

a storage medium;

a slider having an air bearing surface (ABS) facing a surface of the storage medium;

a sense current source providing a sense current (I);

readback circuitry adapted to read back information from the storage medium in response to a readback signal;

a spin valve magnetoresistive sensor as defined in claim 1 which is adapted to receive the sense current I therethrough and provide the readback signal in response to magnetic fluctuations on the storage medium surface.

14. The storage system of claim 11 wherein the sensor plane is substantially aligned with the air bearing surface (ABS) of the slider.

15. A storage system for storing information, comprising:

a storage medium and a sensor for reading information from the storage medium, the sensor including an artificial antiferromagnetic layer which includes ferromagnetic layers; and means for applying a magnetic DC bias field to the artificial antiferromagnetic layer and for aligning magnetic field vector components in the ferromagnetic layers of the artificial antiferromagnetic layer perpendicular to a plane of the sensor.

* * * * *

UNITED STATES PATENT AND TRADEMARK OFFICE
CERTIFICATE OF CORRECTION

PATENT NO. : 6,191,926 B1
DATED : February 20, 2001
INVENTOR(S) : Brenda Everitt et al.

It is certified that error appears in the above-identified patent and that said Letters Patent is hereby corrected as shown below:

Column 4,
Line 25, change "whereby" to -- to cause --.
Line 26, after "layers" insert -- to --.
Line 27, after "plane" insert -- and to the DC bias field --.
Lines 55-56, delete "spin flop".

Column 6,
Line 1, change "11" to -- 13 --.
Line 14, after "sensor" insert -- and to the DC bias field --.

Signed and Sealed this

Twenty-ninth Day of January, 2002

*Attest:*

*Attesting Officer*

JAMES E. ROGAN
*Director of the United States Patent and Trademark Office*